March 26, 1957 L. C. STENNING 2,786,900

ELECTRICAL SIGNALLING SYSTEMS

Filed April 16, 1951

INVENTOR
Luis Charles Stenning
BY
[signature]
ATTORNEY

United States Patent Office 2,786,900

Patented Mar. 26, 1957

2,786,900

ELECTRICAL SIGNALLING SYSTEMS

Luis Charles Stenning, Park Hill, Ealing, England, assignor to The General Electric Company Limited, London, England Application April 16, 1951, Serial No. 221,155

Claims priority, application Great Britain April 20, 1950

2 Claims. (Cl. 179—171)

Figure 1:
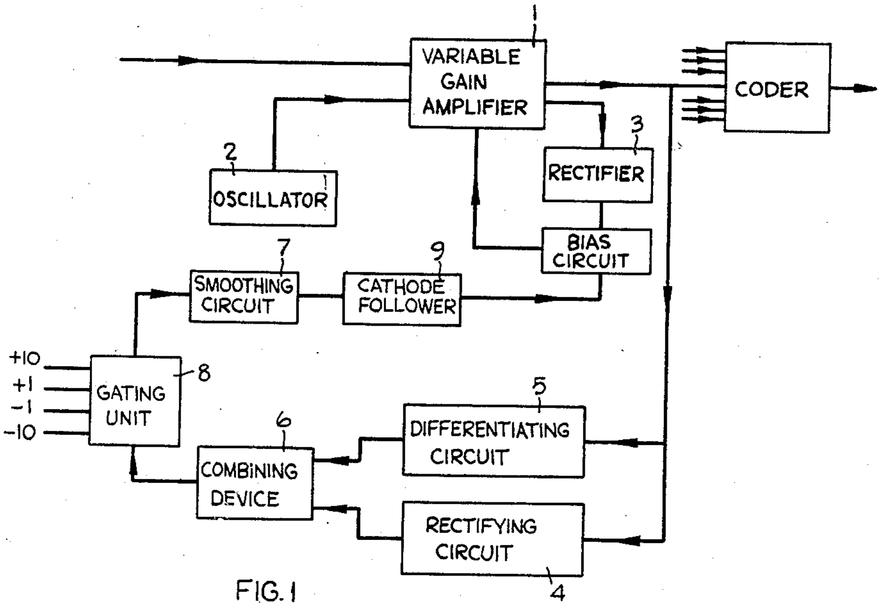

This invention relates to electrical signalling systems.

Where a signal, for example a speech signal, is to be transmitted as modulation on a radio channel, in order to reduce the range of modulation amplitude levels compared with range of input signal amplitude levels, it has been proposed to effect amplitude compression (sometimes referred to as volume compression) of the input signal before feeding it to the modulator. This compression is usually effected in response to the mean level of the input signal over a short period. Thus, if it is required to restrict the range of amplitude transmitted, this may be done by compression so as to ensure, on the one hand, that high intensity peaks in the input signal are reduced and, on the other hand weak signals are kept above the noise level. Amplitude compression may be carried out by passing the input signal through an amplifier provided with automatic gain control which is arranged so as to control the gain of the amplifier in response to the mean level of the input signal. At the receiver, amplitude expansion is effected in a similar manner in response to the mean level of the received modulation so as to produce a signal which may have a similar range of amplitude levels to the original signal.

Amplitude compression and expansion is of particular advantage in a signalling system which permits only a limited number of discrete amplitude levels to be transmitted, for example a pulse signalling system which uses pulse code modulation.

One object of the present invention is to provide improved apparatus for effecting amplitude compression and expansion of electric signals.

According to a feature of the present invention, apparatus for effecting amplitude compression of an electric signal comprises a variable-gain amplifier which is arranged to pass both the said signal and oscillations having a predetermined amplitude, means to rectify the said oscillations passed through the amplifier, means to produce a signal which is used to control the gain of the amplifier from the difference between the rectified oscillation voltage and a delay voltage, means to produce a unidirectional voltage representing the mean level over a relatively short time of the said electric signal after passing through the said amplifier, that is to say after compression, and gating means arranged periodically and under the control of comparison means to supply an electric pulse or pulses of predetermined size to smoothing means the output from which is, or from which is arranged to be derived, the said delay voltage, the said comparison means being arranged to control the gating means to supply a pulse or pulses to the smoothing means when the voltage difference between the said unidirectional voltage representing the mean level of the compressed signal and the output of said smoothing means exceeds a predetermined value, or one of a number of predetermined values, the arrangement being such that, in operation, an increase in the level of the input signal results in a decrease in the amplification of said amplifier and there is arranged to be supplied a signal defining the pulse or pulses which may periodically be supplied by the said gating means to the smoothing means.

It is essential that the pulses supplied by the gating means are of accurately controlled amplitude and width. The arrangement may be such that periodically one pulse having a predetermined width and any one of four amplitudes which are in the ratio of +N:+1:−1:—N, where N may be but is not necessarily an integer, may be supplied, under the control of the comparison means, by the gating means. The signal defining the pulses supplied by the gating means, that is to say the amount of compression, may, in that case, be a pulse code signal, each quantum of information being made up of a group of four pulse time-positions corresponding to the four amplitudes respectively.

According to another feature of the present invention, apparatus for effecting amplitude expansion of a first electric signal by an amount defined by a second electric signal, comprises a variable-gain amplifier which is arranged to pass both the first signal and oscillations having an amplitude determined by a unidirectional potential, means to rectify the said oscillation passed through the amplifier, means to produce a signal which is used to control the gain of the amplifier from the difference between the rectified oscillation voltage and a fixed delay voltage, and gating means arranged periodically and under the control of the second signal to supply an electric pulse or pulses of predetermined size to smoothing means the output from which is, or from which is arranged to be derived, the said unidirectional potential.

It is again essential that the pulses supplied by the gating means are of accurately controlled amplitude and width. The arrangement may be such that periodically one pulse having a predetermined width and any one of four amplitudes which are in the ratio +N:+1:−1:—N, where N may be but is not necessarily an integer, may be supplied, under the control of the second signal. The second signal may, in that case, be a pulse coded signal, each quantum of information being made up of a group of four pulse time-positions corresponding to the four amplitudes respectively.

Alternatively in a pulse code modulation system in which the coded signal of a compressed input signal is made up of groups of pulse time-positions representing successive samples of the compressed signal, periodically one group of pulse time-positions instead of representing a sample of the compressed signal may represent, in like manner, a sample of a voltage which is determined by the amount of compression.

Figure 2:
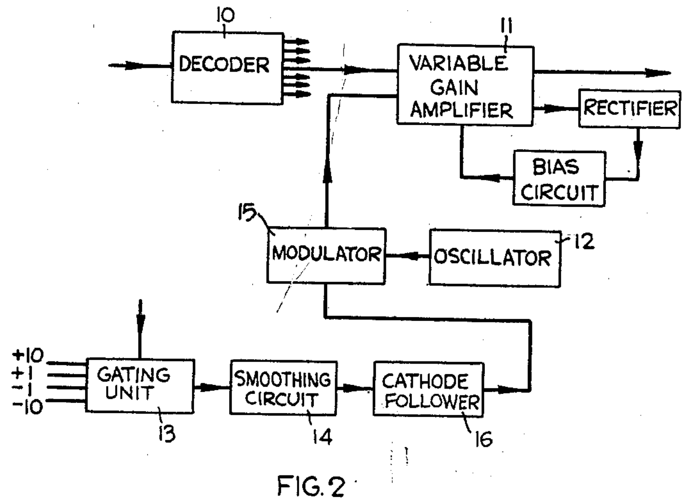

Apparatus for effecting amplitude compression and expansion in accordance with the present invention will now be described by way of example with reference to the two figures of the accompanying drawings in which:

Figures 1 and 2 show diagrammatically the amplitude compression and expansion apparatus respectively of a signalling system which uses pulse code modulation.

The signalling system is arranged to send from a transmitting station to a receiving station, for example by radio, a time multiplex pulse code signal carrying the intelligence on a number, say twelve, of speech channels, each time-position in the pulse code signal having a pulse element in the form either of a pulse or no pulse. The component of the multiplex signal corresponding to a particular channel consists of groups of pulse time-positions each group defining the amplitude of one sample of the signal on the appropriate speech channel and successive groups in respect of that channel being spaced 150 microseconds apart. The groups of pulse time-positions of the several speech channels are interlaced with one another in the multiplexed signal.

Considering now the amplitude compression apparatus associated with one of the speech channels at the transmitting station and referring to Figure 1 of the accompanying drawings, the speech signal, that is to say an audio frequency signal, is passed through a variable gain amplifier 1 before being quantized and coded. The gain of this amplifier 1 is arranged to be varied in an accurately controlled manner to supply the compressed signal. For this purpose the amplifier 1 is adapted to pass both the speech signal and reference oscillations having a frequency of 80 kilocycles per second. These reference oscillations are supplied by an oscillator 2 and have a constant amplitude. After amplification the oscillations are separated from the compressed speech signal and are fed to a rectifier 3. A unidirectional delay voltage is provided, as hereinafter described, and the voltage of the rectified oscillation above the delay voltage is utilized to control the gain of the amplifier 1.

The arrangement is such that the gain of the amplifier 1 rapidly follows changes in the delay voltage, a decrease in the delay voltage resulting in a decrease in gain. A portion of the compressed output from the amplifier 1 is fed to a rapidly acting rectifying circuit 4 which is designed to follow the envelope of the signal fed to its input. The rapidity with which the circuit can follow changes in envelope may be adjusted to suit any required condition, for example a quick rise and slow fall of output for a rapidly rising and falling input signal.

A differentiating circuit 5 is also fed from the output of the amplifier 1, the output of the rectifying circuit 4 and differentiating circuit 5 being combined in a device 6, the output of which is dependent upon the sum of the outputs of the rectifying and differentiating circuits 4 and 5. This is arranged so that the voltage output of the device 6 will quickly follow a sudden increase, say, in the general level of compressed speech but does not follow the rapid fluctuation between syllables.

The voltage output of the device 6 is compared with the voltage of a signal supplied by a smoothing circuit 7 and the difference in these two voltages is utilized to control a gating unit 8. The gating unit 8 may supply, once every 600 microseconds, an electric pulse of predetermined width and having any one of four amplitudes which are in the ratio of $+10:+1:-1:-10$. The amplitude of the pulse passed by the gating unit 8 to the smoothing circuit 7 is dependent upon the said comparison of the two voltages. The smoothing circuit 7 has a relatively long time constant so that a single pulse supplied thereto results in only a comparatively small change in the output voltage. This output voltage is fed through a cathode follower stage 9 to provide the said delay voltage.

The gain control arrangement of the amplifier 1 is such that if, for example, there is a sudden increase in the level of the input speech signal a train of $-10$ unit pulses spaced 600 microseconds apart will be supplied to the smoothing circuit. On the other hand a small decrease of input level would result in the train of $+1$ unit pulses which might be spaced 1200 microseconds apart, that is to say one pulse is supplied only on alternate instances when one could be supplied.

Information as to the magnitude of the pulses, if any, passed by the gating unit to the smoothing circuit is transmitted by the transmitting station as a further pulse signal which is time-multiplexed with the coded pulse signal carrying the compressed speech signal. It will be appreciated that only one quantum of this information, which is a measure of the amount of amplitude compression effected, is to be transmitted every 600 microseconds, that is say only once during the period in which groups of pulses in respect of four samples are transmitted. These four pulse time-positions defining one quantum of amplitude compression information are added one to each of the four groups of pulse time-positions transmitted in respect of that speech channel during each period of 600 microseconds. It will be appreciated that the information transmitted in the pulse groups associated with any one speech channel regarding the amount of compression refers only to the amplitude compression on that particular channel. It is therefore necessary to provide a variable gain amplifier and its associated gain control circuit as described above for each speech channel. The final multiplex signal transmitted by the transmitting station thus contains groups of five adjacent pulse time-positions in respect of each speech channel which are repeated every 150 microseconds.

At the receiving station the received multiplex signal is divided, for example by passing through a gating device, into a pulse signal carrying the intelligence of all the channels in time multiplex and a pulse signal carrying the compression information of the several channels also in time multiplex. The first of these signals is then fed to a decoder which synthesises and separates the several compressed speech signals. The amplitude compression signal is broken up into the separate pulse signals for each channel and it will be appreciated that each of these channel signals will consist of one pulse time-position at which there may or may not be a single pulse every 150 microseconds, four of these pulse time-positions defining one quantum of compression information. This quantum of information does not of course define absolutely the compression effected at the transmitting station.

Referring now to Figure 2 and considering one particular compressed speech signal supplied by the decoder 10, this is passed through a variable gain amplifier 11, the gain of which is determined by the transmitted compression information, so as to reproduce the original speech signal within the limits of accuracy of quantizing at the transmitting station. This amplifier 11 is identical with the corresponding amplifier 1 at the transmitting station being adapted to pass both the speech signal and 80 kilocycle per second oscillations supplied by an oscillator 12. The rectified oscillations passed through the amplifier are again utilised to control the gain thereof but in this case there is a fixed delay voltage (the source of this delay voltage is not shown).

A gating unit 13 is again arranged to supply pulses to a smoothing circuit 14, the output from which is used via a cathode follower stage 16 to amplitude modulate, by means of the modulator 15, the level of 80 kilocycles per second oscillations supplied by the oscillator 12. This gating unit 13 is arranged to supply, under the control of the receiving compression information of that channel, a single pulse having a predetermined width and any one of four amplitudes which are in the ratio of $+10:+1:-1:-10$. Thus depending upon which of these values, if any, is signalled in each quantum of amplitude compression information, the corresponding pulse may be supplied to the smoothing circuit once every 600 microseconds.

It is essential for correct operation that at the transmitting and receiving station the widths and amplitudes of the pulses which may be supplied by the gating units 8 and 13 are the same, the smoothing circuits 7 and 14 have the same time constant, and the voltage of the output signals from the smoothing circuits 7 and 14 have the same effect but in the opposite sense on the gain of the two amplifiers 1 and 11 respectively. It will be appreciated that if these conditions are satisfied the overall gain of the system is constant, that is to say the amount of amplitude compression and expansion at the transmitting and receiving stations respectively will be the same at all instants.

Instead of signalling the amplitude compression information in place of speech signal information in the transmitted pulse code signal, one of the twelve "channels" may be utilised to provide a number of sub-channels over which is signalled inter alia the compression information of all the remaining channels. Thus, if each sample of a compressed speech signal is represented by the presence or absence of pulses at each of a group of four time-positions in the transmitted pulse code signal, the sub-channel associated with that speech signal may be a single pulse time-position at which there may or may not be a single pulse and which recurs once every four groups of pulse time-positions corresponding to that channel. Each quantum of compression information is then given merely by the presence or absence of a pulse at the appropriate time-position in the transmitter pulse code signal.

It will be appreciated that the invention is not restricted to systems making use of pulse code modulation and may, for example, be used accurately to control the amplitude compression and expansion at the terminals of a two-wire telephone circuit to prevent "singing."

I claim:

1. Apparatus for effecting amplitude compression of an electric signal, said apparatus comprising means for supplying oscillations of a predetermined amplitude, a variable-gain amplifier for passing both said signal and said oscillations, means to rectify said oscillations after passage through the amplifier, smoothing means supplying a delay voltage, means to produce a signal for controlling the gain of the amplifier from the difference between the rectifier oscillation voltage and said delay voltage, means to produce a uni-directional voltage representing the mean level over a relatively short time of said electric signal after passage through the amplifier, that is to say after compression, comparison means responsive to the voltage difference between said mean level uni-directional voltage and the delay voltage, periodically operative gating means under the control of the comparison means for supplying at least one electric pulse of predetermined size to the smoothing means when the said voltage difference between the mean level uni-directional voltage and the delay voltage exceeds at least one predetermined value, an increase in the level of the input signal resulting in a decrease in the amplification of said amplifier, and means supplying a signal defining the pulse or pulses which may be supplied periodically by the gating means to the smoothing means.

2. Apparatus for effecting amplitude expansion of a first electric signal by an amount defined by a second electric signal, said apparatus comprising means supplying oscillations having an amplitude determined by a uni-directional potential, a variable-gain amplifier for passing both the first signal and said oscillations, means to rectify the oscillations after passage through the amplifier, means providing a fixed delay voltage, means to produce a signal for controlling the gain of the amplifier from the difference between the rectified oscillation voltage and the fixed delay voltage, smoothing means supplying said uni-directional potential, and periodically operative gating means under the control of the second signal to supply at least one electric pulse of predetermined size to said smoothing means so as to vary said uni-directional potential supplied by the smoothing means and thereby change the gain of the variable-gain amplifier.

References Cited in the file of this patent

UNITED STATES PATENTS

| | | |
|---|---|---|
| 2,193,966 | Jones | Mar. 10, 1940 |
| 2,231,538 | Kreer | Feb. 11, 1941 |
| 2,387,652 | Dickieson | Oct. 23, 1945 |
| 2,527,650 | Peterson | Oct. 31, 1950 |
| 2,572,900 | Winkler | Oct. 30, 1951 |
| 2,586,825 | Jacobsen | Feb. 26, 1952 |